United States Patent [19]

Reinberg

[11] 4,200,666
[45] Apr. 29, 1980

[54] SINGLE COMPONENT MONOMER FOR SILICON NITRIDE DEPOSITION

[75] Inventor: Alan R. Reinberg, Dallas, Tex.

[73] Assignee: Texas Instruments Incorporated, Dallas, Tex.

[21] Appl. No.: 930,452

[22] Filed: Aug. 2, 1978

[51] Int. Cl.$^2$ ............................................. B05D 3/06
[52] U.S. Cl. ...................................... 427/39; 427/94
[58] Field of Search ........................ 427/38, 39, 94, 95

[56] References Cited

U.S. PATENT DOCUMENTS 3,424,661  1/1969  Androshuk et al. ................... 427/39

*Primary Examiner*—John H. Newsome
*Attorney, Agent, or Firm*—Gary C. Honeycutt; Richard L. Donaldson; James T. Comfort

[57] ABSTRACT

Method of preparing silicon nitride film by glow discharge from the decomposition of liquid trisilylamine, $(SiH_3)_3N$, which is a volatile monomer. In this connection, the use of a single monomer as diluted with an inert gas enables greater uniformity to be achieved in the deposition of silicon nitride films. Further, the presence of Si-N bonds in the monomer enables more control and better stoichiometry in the deposited films.

6 Claims, No Drawings

SINGLE COMPONENT MONOMER FOR SILICON NITRIDE DEPOSITION

FIELD OF THE INVENTION

This invention relates in general to a method for the preparation of silicon nitride films by glow discharge, and more particularly to a method for the preparation of silicon nitride films by the glow discharge from the decomposition of trisilylamine in a plasma reactor.

DESCRIPTION OF THE PRIOR ART

Silicon nitride films are used in the fabrication of semiconductor devices as masking layers and protective dielectric coatings. Present plasma deposition of silicon nitride films comprise combining a silicon containing gas such as silane with a nitrogen containing gas such as ammonia, and subjecting the gas composition to a glow discharge. The ratio of silicon containing gas to nitrogen containing gas is adjusted in variable proportions.

The general formula for silicon nitride is $SiN_x$, wherein X ranges from 0 to about 1.3. It is found that due to gas compositional changes within different parts of the plasma reactor, there results differences in the value of X or stoichiometry of the deposited nitride film. The compositional changes in the silicon nitride film also greatly varies with the pressure and power factor of the reactor. Variable stoichiometry of the silicon nitride film results in the undesirable properties that the film has variable etch rates and variable electrical conductivity in different parts thereof. The present invention is an effective, practical and ideal solution to the above-noted problems.

SUMMARY OF THE INVENTION

Accordingly, an object of the present invention is to provide a method for the preparation of silicon nitride films having uniform stoichiometry.

Another object of the present invention is to provide a method for the preparation of silicon nitride films from a single monomer comprising trisilylamine.

Yet another object of the present invention is to provide a method for the preparation of silicon nitride films having uniform etch rate and electrical conductivity, independent of the operating characteristics of the plasma reactor.

A silicon nitride film having uniform, controlled stoichiometry is prepared by glow discharge in a plasma reactor by the decomposition of liquid trisilylamine, which is a volatile monomer. The monomer may be diluted with an inert gas, including by way of illustration, argon, nitrogen, helium or krypton.

The monomer may additionally be diluted with $NH_3$ as a source of nitrogen molecules in adjusting the silicon nitride stoichiometry.

DETAILED DESCRIPTION

Silicon nitride films prepared in accordance with the present invention are tough, adherent, chemically inert, pinhole free, and have considerable application for protective insulating layers or passivation. The films are uniform in thickness and chemical composition, as well as having uniform etch rates and electrical conductivity. They also provide excellent surface conformity in step coverage.

By way of illustration, the method of the present invention may be practiced in a plasma reactor as illustrated in U.S. Pat. No. 3,757,733. In operation, the plasma reactor is first loaded with slices of material to be coated. After loading the slices, evacuation of the chamber is commenced. Since the deposition is effected at an elevated temperature, the heating means are generally iniated during evacuation. Both before and during the pump down, the flow of inert gas is continuously open to the reactor, preventing contamination from backstreaming. The samples or slices are allowed to reach the desired temperature. The reactive gas is turned on through the feed tube. The flow rates are adjusted if necessary and the pump valved down to give the desired operating pressure. The RF power is then established and deposition allowed to take place for the desired length of time. Several methods exist in the prior art for insitu monitoring of the film thickness which can be used if very accurate coatings are desired.

The primary novelty of the present invention is in the use of a single monomer for the preparation of silicon nitride films by glow discharge in a plasma reactor. The monomer selected comprises trisilylamine, $(SiH_3)_3N$, and an inert gas may be included by way of illustration, from argon, nitrogen, krypton or helium. The use of a single stable monomer comprised solely of silicon and nitrogen replaces the prior art process of combining two reactive gases with their associated deficiencies as noted above.

To supply additional nitrogen atoms during the formation of silicon nitride, ammonia, $NH_3$, having a lower bonding energy than $N_2$ may be incorporated into the plasma gas mixture. The incorporation of a nitrogen containing gas allows for the adjustment of the value of X in the deposited silicon nitride film, $SiN_x$, where x may vary from about 0 to about 1.3. Where a non nitrogen containing gas is included, the stoichiometry of the deposited silicon nitride film will be fixed dependent upon the amount of available nitrogen from the trisilyamine.

By way of illustration, the following range of operating conditions have utility in the method of the present invention. The total pressure in the plasma reactor is operated in the range of about 300 millitorr-2 torr where the ratio of partial pressure of trisilyl mine to inert gas or ammonia is in the range of about 0.1–1.0. The reactor is operated at an RF power level of about 0.040–0.20 watts per square centimeter at an elevated temperature of about 200–350 degrees centigrade giving a deposition rate of about 200–1000 angstroms per minute.

In an illustrative example, the inert gas comprises nitrogen having a measured partial pressure of about 400 millitor and a trisilylamine partial pressure of about 100 millitorr. The reactor is operated at an RF power level of about 0.12 watts per square centimeter at about 250° centigrade giving a deposition rate of about 500 angstroms per minute.

In another illustrative example, $NH_3$ having a measured partial pressure of about 200 millitorr and trisilylamine having a partial pressure of about 100 millitorr are combined to provide the plasma gas composition. The reactor is operated at an RF power level of about 0.12 watts per square centimeter at about 250° centigrade giving a deposition rate of about 500 angstroms per minute.

It is recognized that the above parameters are exempalary only and may be varied considerably as apparent to those skilled in the art without departing from the spirit and scope of the present invention which is defined by the appended claims.

What is claimed is:

1. A method for the preparation of a silicon nitride film in the fabrication of a semiconductor device comprising subjectng an inert gas and trisilyamine to an RF glow discharge of 0.04 to 0.20 watts per $cm^2$ in the presence of said semiconductor device.

2. A method of preparing a silicon nitride film from a single monomer comprising combining an inert gas with trisilyamine as the sole source of Si and N and subjecting said combination to an RF glow discharge in the presence of a semiconductor device.

3. The method of claim 1 or 2 wherein said inert gas is selected from the group consisting of argon, helium and krypton.

4. The method of claim 1 or 2 wherein said glow discharge is produced in a plasma reactor.

5. The method of claim 4, wherein said plasma reactor is operated at a power level in the range of about 0.04–0.20 watts per square centimeter.

6. The method of claim 4 wherein said plasma reactor is operated at a power level of abouty 0.12 watts per square centimeter.